US006977206B2

(12) United States Patent
Huang et al.

(10) Patent No.: US 6,977,206 B2
(45) Date of Patent: Dec. 20, 2005

(54) HEATING PLATE CRYSTALLIZATION METHOD

(75) Inventors: Shun-Fa Huang, Hsinchu (TW); Chi-Lin Chen, Hsinchu (TW); Chiung-Wei Lin, Hsinchu (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 0 days.

(21) Appl. No.: 10/648,290

(22) Filed: Aug. 27, 2003

(65) Prior Publication Data

US 2004/0253797 A1    Dec. 16, 2004

(30) Foreign Application Priority Data

Jun. 12, 2003   (TW) .............................. 92115941 A

(51) Int. Cl.[7] .................... H01L 21/20; H01L 21/00
(52) U.S. Cl. ....................... 438/486; 438/166
(58) Field of Search .................... 438/486, 487, 438/166; 257/66, 70, 75

(56) References Cited

U.S. PATENT DOCUMENTS

| | | | |
|---|---|---|---|
| 5,219,786 A * | 6/1993 | Noguchi ......................... 438/5 |
| 5,265,114 A * | 11/1993 | Sun et al. ...................... 372/69 |
| 5,403,772 A * | 4/1995 | Zhang et al. ................. 438/166 |
| 5,608,232 A * | 3/1997 | Yamazaki et al. ............. 257/66 |
| 5,824,574 A * | 10/1998 | Yamazaki et al. ........... 438/150 |
| 6,087,245 A * | 7/2000 | Yamazaki et al. ........... 438/486 |
| 6,602,765 B2 * | 8/2003 | Jiroku et al. ................. 438/487 |
| 2003/0059991 A1 * | 3/2003 | Teramoto et al. ........... 438/166 |

* cited by examiner

*Primary Examiner*—Matthew Smith
*Assistant Examiner*—Lex H. Malsawma
(74) *Attorney, Agent, or Firm*—Bacon & Thomas, PLLC

(57) ABSTRACT

The present invention relates to a heating plate crystallization method used in the crystallization process for the poly-silicon thin-film transistor, and more particularly, the present invention relates to a heating plate crystallization method by using a pulsed rapid thermal annealing process (PRTP). By means of the characteristic provided by the present invention, namely, the heating plate area has a better absorption rate to the infrared rays and has a high thermal stability. The heating plate area is used for absorbing the infrared rays, and after the heating, the energy is indirectly transferred to the amorphous layer via a thermal conduction method so that the amorphous layer will be rapidly crystallized to form the poly-silicon. Furthermore, the present invention uses the pulsed rapid thermal annealing process (PRTP) using the infrared rays to instantly heat, to selectively heat the materials by taking the advantage that different materials have different absorption rates to the infrared rays. However, the glass substrate and the amorphous cannot effectively absorb the infrared rays so that the glass substrate will not be broken while the process temperature of the heating plate area is excessively high (>700° C.). Therefore, the most effective rapid thermal crystallization can be achieved.

11 Claims, 3 Drawing Sheets

FIG..3C

HEATING PLATE CRYSTALLIZATION METHOD

BACKGROUND OF THE INVENTION

1. Field of the Invention

The present invention relates to a heating plate crystallization method used in the crystallization process for the poly-silicon thin-film transistor, and more particularly, to a heating plate crystallization method using a rapid thermal annealing process.

2. Description of the Prior Art

The prior art crystallization technology includes the solid phase crystallization technology and the excimer laser annealing (ELA) technology. Because the crystallization temperature required by the solid phase crystallization method (SPC) is about 600° C. and the deformation temperature of the glass substrate (Corning 1737) is about 666° C., the solid phase crystallization method (SPC) cannot be accomplished on a cheaper glass substrate, and a material with high price is required, such as quartz chip. The limitation over the material will cause the manufacture cost increased. When applying the excimer laser annealing (ELA) technology, although the temperature of the substrate for the crystallization process is lower than that of the solid phase crystallization method, the facility requirement of the ELA technology is relatively high. Therefore, the technology of the present invention provides a poly-silicon thin-film transistor having a structure of a heating plate area. By means of the special characteristic of the heating plate area, namely, the selective heating, the poly-silicon thin-film transistor can be crystallized under the status of high temperature, and the substrate will not be damaged. Therefore, the technology according to the present invention is suitable in the glass substrate, and the facility is inexpensive. This makes the inventive technology is highly valuable in the industry.

The prior art the metal induced lateral crystallization (MILC) method uses a heating tube to heat the seed deposited on the amorphous layer. Please refer to FIG. 1A to 1D show the flowchart of a prior art the metal induced lateral crystallization method. Please refer to FIG. 1A. In the first step of the prior art the metal induced lateral crystallization method, a amorphous layer 20 is formed on a glass substrate 10. Next, please refer to FIG. 1B, in the second step of the method, the metal, such as Ni, Pd, and so on, is deposited on the amorphous layer 20 by using the physical vapor depositing or electroplating method. Then, please refer to FIG. 1C. In the third step of the method, by using the lithography, etching processes, the local metal distribution is formed so as to advantage the following metal induced lateral crystallization (MILC) process. By the amorphous layer 20 and the metal thin-film deposited on the amorphous layer 20, the silicide 31 is formed. The silicide 31 can be used as the seed for the amorphous layer 20 to be crystallized so as to form the poly-silicon 32. The silicon molecules of the amorphous layer 20 can be melted by the silicide 31 so as to separate out the crystal. Please refer to FIG. 1D. In the final step of the prior art the metal induced lateral crystallization method, in the thermal annealing system, the metal induced lateral crystallization stage is performed so as to advance the amorphous layer 20 to be crystallized so as to form the poly-silicon 32. When the metal induced lateral crystallization (MILC) is occurred on the amorphous layer 20, the silicide formed by melting will spread to the non-defined amorphous layer. Therefore, the metal pollution will appear in the TFT device channel area so that the electric leakage of the TFT device will be increased and the electricity of the TFT device will be affected.

Therefore, in order to resolve the mentioned problems, the present invention provides a heating plate crystallization method used in the crystallization process for the poly-silicon thin-film transistor, and more particularly, the present invention relates to a heating plate crystallization method by using a rapid thermal annealing process. The difference between the inventive method and the metal induce lateral crystallization method is that the heating plate area provided by the inventive method will not be melted with the amorphous layer to form the silicide. Therefore, it is not to induce the lateral crystallization by using the silicide. In the present invention, the heating plate area has a better absorption rate to the infrared rays and a high thermal stability. By using the heating plate area to absorb the infrared rays, after the heating, the energy is indirectly transferred to the amorphous layer via a thermal conduction method so that the amorphous layer is rapidly crystallized to form the poly-silicon. Furthermore, a thin oxide layer is deposited between the heating plate area and the amorphous layer, and when using the oxide layer to stop the rapid thermal annealing process, the high thermal diffusion will occur between the heating plate area and the amorphous layer so as to effectively avoid the metal pollution in TFT device channel area. Furthermore, the present invention uses the pulsed rapid thermal annealing process (PRTP), using the infrared rays to instantly heat, to selectively heat the materials by taking the advantage that different materials have different absorption rates to the infrared rays. The glass substrate and the amorphous cannot effectively absorb the infrared rays so that the glass substrate will not be broken while the process temperature of the heating plate area is excessively high (>700° C.). Therefore, the most effective rapid thermal crystallization by HPC method can be achieved.

SUMMARY OF THE INVENTION

The present invention relates to a heating plate crystallization method used in the crystallization process for the poly-silicon thin-film transistor, and more particularly, the present invention relates to a heating plate crystallization method by using a rapid thermal annealing process. The present invention uses the pulsed rapid thermal annealing process (PRTP) , using the infrared rays to instantly heat, to selectively heat the materials by taking the advantage that different materials have different absorption rates to the infrared rays. The glass substrate and the amorphous layer cannot effectively absorb the infrared rays so that the glass substrate will not be broken while the process temperature of the heating plate area is excessively high (>700° C.).

Another object of the present invention is to provide a heating plate crystallization method used in a crystallization process for a poly-silicon thin-film transistor, and more particularly, to a heating plate crystallization method using a rapid thermal annealing process. The heating plate area of the present invention will not be melted with the amorphous layer to form the silicide. Therefore, it is not to induce the lateral crystallization by using the silicide. In the present invention, the heating plate area has a better absorption rate to the infrared rays and a high thermal stability. By using the heating plate area to absorb the infrared rays, after the heating, the energy is indirectly transferred to the amorphous layer via a thermal conduction method so that the amorphous layer is rapidly crystallized to form the poly-silicon.

Another object of the present invention is to provide a heating plate crystallization method used in a crystallization process for a poly-silicon thin-film transistor, and more particularly, to a heating plate crystallization method using a rapid thermal annealing process. A thin oxide layer is deposited between the heating plate area and the amorphous layer, when using the oxide layer to stop the rapid thermal annealing process, the high thermal diffusion will occur between the heating plate area and the amorphous layer so as to effectively avoid the metal pollution in TFT device channel area.

In order to resolve the mentioned objects, a heating plate crystallization method according to the present invention is applied in a crystallization process for a poly-silicon thin-film transistor. The method comprises: forming a substrate; depositing a non-crystal layer on the substrate; and then depositing a heating plate layer on the non-crystal layer, wherein a heating plate area is obtained on the heating plate layer by using a lithography etching process, and by means of the characteristics of the heating plate area, namely, it has a better absorption rate to the infrared rays and has a high thermal stability, the heating plate area is used for absorbing the infrared rays, and after the heating, the energy is indirectly transferred to the amorphous layer via a thermal conduction method so that the amorphous layer is rapidly crystallized to form the poly-silicon.

BRIEF DESCRIPTION OF THE DRAWINGS

The accompanying drawings, which are incorporated in and form part of the specification in which like numerals designate like parts, illustrate preferred embodiments of the present invention and together with the description, serve to explain the principles of the invention. In the drawings:

FIGS. 3A, 3B, 3C, 3D, show the flowchart of a heating plate crystallization method according to another preferred embodiment of the present invention.

DETAILED DESCRIPTION OF THE PREFERRED EMBODIMENT

Figure 1A:
FIGS. 1A, 1B, 1C, 1D show the flowchart of a prior art metal induced lateral crystallization method.
Figure 1B:
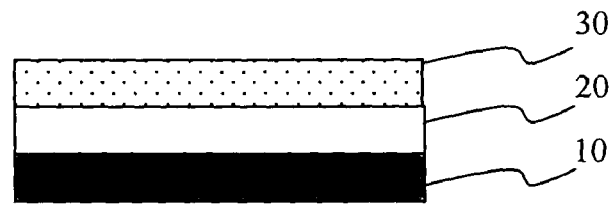
Figure 1C:
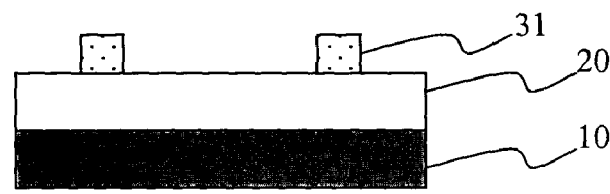
Figure 1D:
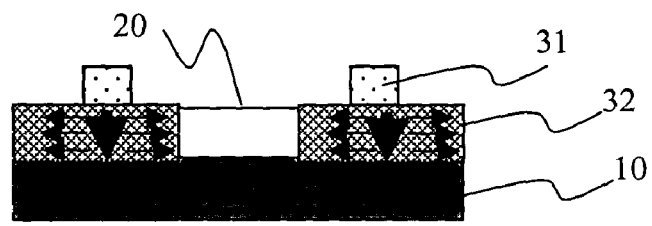
Figure 2A:
FIGS. 2A, 2B, 2C, 2D, 2E show the flowchart of a heating plate crystallization method according to a preferred embodiment of the present intention.
Figure 2B:
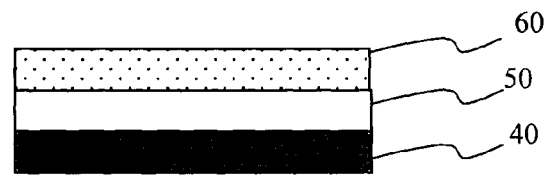
Figure 2C:
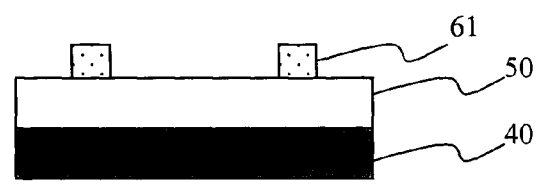
Figure 2D:
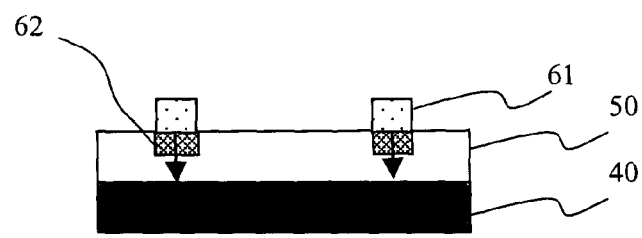
Figure 2E:
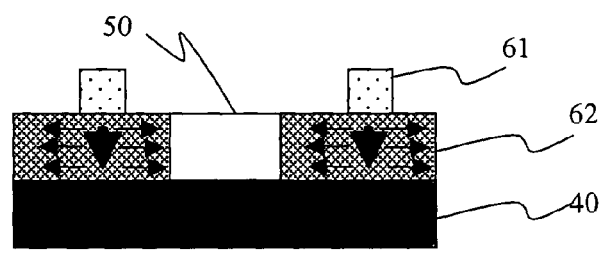

The present intention provides a heating plate crystallization method to be applied in a crystallization for a poly-silicon thin-film transistor. The heating plate crystallization method comprises the steps of forming a amorphous layer on a substrate, and depositing a heating plate layer on the amorphous layer. A heating plate area is presented on the heating plate layer by using a lithography etching process. Please refer to FIGS. 2A to 2E. They show the flowchart of a heating plate crystallization method according to a preferred embodiment of the present invention. Please refer to FIG. 2A. In the first step of the heating plate crystallization method according to the present invention, a amorphous layer 50 is formed on a glass substrate 40. Next, please refer to FIG. 2B, in the second step, by using a physical vapor depositing method (PVD), the metal, such as MoW, Cr, and so on, which can absorb the infrared rays and has a high thermal stability, is deposited on the amorphous layer so as to form a heating plate layer 60. Then, please refer to FIG. 2C. In the third step, by using the processes of lithography, etching and so on, the local metal distribution is formed. The local metal distribution is the heating plate area 61. Please refer to FIG. 2D. In the fourth step, the heating plate area 61 is used for absorbing the infrared rays. After the heating, the energy is indirectly transferred to the amorphous layer 50 via a thermal conduction method so that the amorphous layer 50 is rapidly crystallized to form the poly-silicon 62.

Finally, enter the thermal annealing system. Please refer to FIG. 2E. In the final step of the inventive heating plate crystallization method, the rapid thermal annealing process system using the infrared rays for heating is applied. By using the infrared rays for instant heating, the selective heating is performed in accordance with the characteristic of the different materials having different absorption rates to the infrared rays (IR). The glass substrate 40 and the amorphous 50 cannot effectively absorb the infrared rays so that the glass substrate will not be broken while the process temperature of the heating plate area is excessively high (>700° C.). By means of the characteristic of the heating plate area having a better absorption rate to the infrared rays and a high thermal stability, the heating plate area is used for absorbing the infrared rays, and after the heating, the energy is indirectly transferred to the amorphous layer via a thermal conduction method so that the amorphous layer is rapidly crystallized to form the poly-silicon.

Figure 3A:
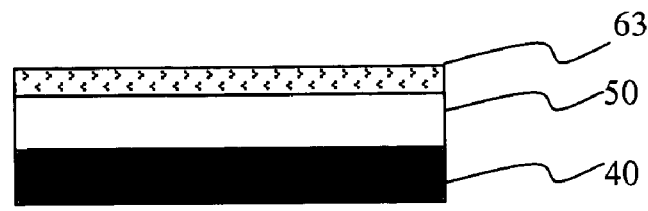
Figure 3B:
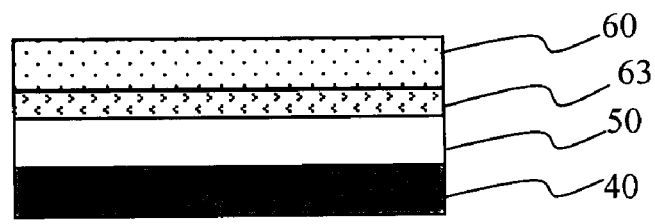
Figure 3D:
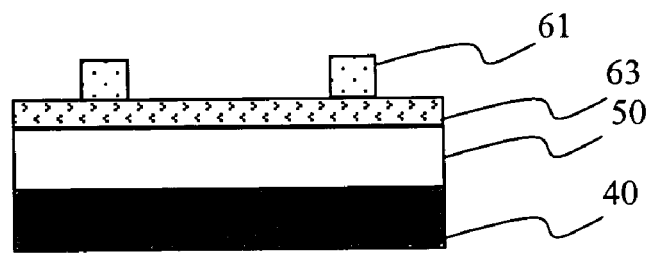
Figure 3D:
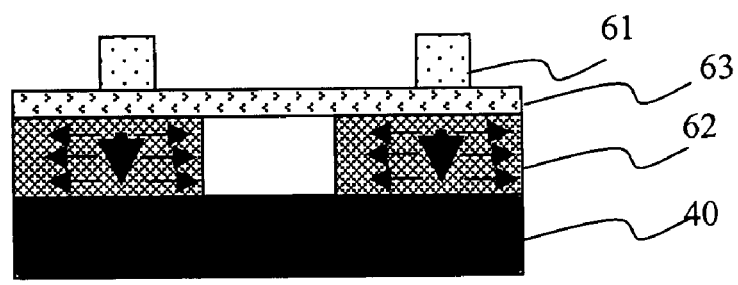

In addition, a thin oxide layer is deposited between the heating plate area and the amorphous layer, and when using the oxide layer to stop the rapid thermal annealing process, the high thermal diffusion will occur between the heating plate area and the amorphous layer so as to effectively avoid the metal pollution in TFT device channel area. Please refer to FIGS. 3A to 3D. They show the flowchart of a heating plate crystallization method according to another preferred embodiment of the present invention. The method is a thin-film transistor heating plate crystallization method having a thin oxide layer. In the above method, a amorphous layer is deposited on a substrate, a thin oxide layer is deposited on the amorphous layer and then a heating plate layer is deposited on the thin oxide layer. Next, a heating plate area is presented on the heating plate layer via a lithography etching process. Please refer to FIG. 3A. A amorphous layer 50 is deposited on a glass substrate 40, and then a thin oxide layer 63 is deposited on the amorphous layer 50 by using the chemical vapor depositing method. Next, the physical vapor depositing (PVD) method is used for depositing the metal, such as MoW, Cr, and so on, which can absorb the infrared rays and has a high thermal stability, on the thin oxide layer 63 so as to form a heating plate layer 60. The thin oxide layer 63 can prevent the metal from diffusing to the amorphous layer. Next, please refer to FIG. 3C. In the third step of the method, after forming the local metal distribution by using the lithography, etching processes, the local metal distribution is the heating plate area 61. Please refer to FIG. 3D. In the fourth step of the method, enter the thermal annealing system. The rapid thermal annealing process system using the infrared rays for heating is applied. By using the infrared rays for instant heating, the selective heating is performed in accordance with the characteristic of the different materials having different absorption rates to the infrared rays (IR). The glass substrate 40 and the amorphous 50 cannot effectively absorb the infrared rays so that the glass substrate will not be broken while the process temperature of the heating plate area is excessively high (>700° C.). By means of the characteristic of the heating plate area 16 having a better absorption rate to the infrared rays and a high thermal stability, the heating plate area is used for absorbing the infrared rays, and after the heating, the energy is indirectly transferred to the amorphous layer 50 via a thermal conduction method so that the amorphous layer 50 is rapidly crystallized to form the poly-silicon 62.

The above is the detailed description of the heating plate crystallization method according to the present invention. The present invention relates to a heating plate crystallization method used in the crystallization process for the poly-silicon thin-film transistor, and more particularly, the present invention relates to a heating plate crystallization method by using a rapid thermal annealing process. By means of the characteristic provided by the present invention, namely, the heating plate area has a better absorption rate to the infrared rays and has a high thermal stability. The heating plate area is used for absorbing the infrared rays, and after the heating, the energy is indirectly transferred to the amorphous layer via a thermal conduction method so that the amorphous layer will be rapidly crystallized to form the poly-silicon. Furthermore, the present invention uses the pulsed rapid thermal annealing process (PRTP), using the infrared rays to instantly heat, to selectively heat the materials by taking the advantage that different materials have different absorption rates to the infrared rays. The glass substrate and the amorphous cannot effectively absorb the infrared rays so that the glass substrate will not be broken while the process temperature of the heating plate area is excessively high (>700° C.). Therefore, the most effective rapid thermal crystallization by HPC method can be achieved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A heating plate crystallization method for forming a poly-silicon layer, comprising the steps of:
    forming an amorphous silicon layer on a substrate;
    forming a thin oxide layer on the amorphous silicon layer;
    forming a heating plate layer on the thin oxide layer;
    patterning the heating plate layer to form a plurality of heating plate areas on a portion of the thin oxide layer, and another portion of the thin oxide layer is exposed;
    and performing a pulsed rapid thermal annealing process (PRTP) to heat the heating plate areas, wherein heating plate areas transfer a heat energy to the amorphous silicon layer for melting the amorphous silicon layer, and the amorphous silicon layer is changed into a poly-silicon layer.

2. The heating plate crystallization method of claim 1, wherein the substrate is glass.

3. The heating plate crystallization method of claim 1, wherein the thin oxide layer is used to avoid metal pollution to the amorphous silicon layer in the pulsed rapid thermal annealing process (PRTP).

4. The heating plate crystallization method of claim 1, wherein the heating plate layer is made of a metal material with good IR absorption and thermal stability.

5. The heating plate crystallization method of claim 4, wherein the metal material is MoW, Cr, or W.

6. The heating plate crystallization method of claim 1, wherein the pulsed rapid thermal annealing process (PRTP) has a process temperature over 700° C.

7. A heating plate crystallization method for forming a poly-silicon layer, comprising the steps of:
    forming an amorphous silicon layer on a substrate;
    forming a thin oxide layer on the amorphous silicon layer with a thickness sufficient to avoid metal pollution to the amorphous silicon layer during pulsed rapid thermal annealing;
    forming a heating plate layer on the thin oxide layer;
    patterning the heating plate layer to form a plurality of heating plate areas on a portion of the thin oxide layer, and
    performing a pulsed rapid thermal annealing process (PRTP) to heat the heating plate areas, wherein the heating plate areas transfer a heat energy to the amorphous silicon layer for melting the amorphous silicon layer, and the amorphous silicon layer is changed into a poly-silicon layer.

8. The heating plate crystallization method of claim 7, wherein the substrate is glass.

9. The heating plate crystallization method of claim 7, wherein the heating plate layer is made of a metal material with good IR absorption and thermal stability.

10. The heating plate crystallization method of claim 9, wherein the metal material is MoW, Cr, or W.

11. The heating plate crystallization method of claim 7, wherein the pulsed rapid thermal annealing process (PRTP) has a process temperature over 700° C.

* * * * *